United States Patent
Sanwo et al.

[11] Patent Number: 5,977,819
[45] Date of Patent: *Nov. 2, 1999

[54] CMOS GIGABIT SERIAL LINK DIFFERENTIAL TRANSMITTER AND RECEIVER

[75] Inventors: Ikuo Jimmy Sanwo, San Marcos; Joseph Dennis Russell, La Mesa; Juei-Po Lin, La Jolla, all of Calif.

[73] Assignee: NCR Corporation, Dayton, Ohio

[*] Notice: This patent is subject to a terminal disclaimer.

[21] Appl. No.: 08/855,206

[22] Filed: May 13, 1997

Related U.S. Application Data

[63] Continuation of application No. 08/528,004, Sep. 14, 1995, Pat. No. 5,684,429.

[51] Int. Cl.$^6$ ........................................................... H03F 3/45
[52] U.S. Cl. .......................... 327/563; 327/308; 327/321; 330/255
[58] Field of Search .................................. 327/560–563, 327/308, 309, 315, 318–321, 333; 326/73, 81, 86; 330/253, 254, 256

[56] References Cited

U.S. PATENT DOCUMENTS

| | | | |
|---|---|---|---|
| 4,464,633 | 8/1984 | Harwood et al. ........................ | 330/254 |
| 4,533,877 | 8/1985 | Rahim ...................................... | 330/253 |
| 4,769,564 | 9/1988 | Garde ......................................... | 327/52 |
| 4,831,336 | 5/1989 | Dautriche ................................. | 330/253 |
| 4,912,425 | 3/1990 | Kobayashi et al. ..................... | 330/253 |
| 4,963,835 | 10/1990 | Saitoh ....................................... | 330/253 |
| 5,065,055 | 11/1991 | Reed ......................................... | 327/52 |
| 5,132,560 | 7/1992 | Kane ......................................... | 327/65 |
| 5,214,317 | 5/1993 | Nguyen ..................................... | 326/73 |
| 5,376,898 | 12/1994 | Tanaka et al. ........................... | 330/253 |
| 5,477,191 | 12/1995 | Demicheli ................................ | 330/254 |
| 5,525,914 | 6/1996 | Cao et al. ................................. | 326/73 |
| 5,614,843 | 3/1997 | Mita et al. ................................ | 326/73 |

*Primary Examiner*—Timothy P. Callahan
*Assistant Examiner*—Tuan T. Lam
*Attorney, Agent, or Firm*—Merchant Gould Smith Edell Welter and Schmidt

[57] ABSTRACT

A CMOS differential transmitter and matched receiver apparatus and method for transmitting data. The system uses a CMOS bias network to create low voltage swings and optimize the voltage offsets to compensate for variations caused by the manufacturing process, and thereby increase data transmission rates to approximately 1 gigabit per second.

5 Claims, 5 Drawing Sheets

CMOS GIGABIT SERIAL LINK DIFFERENTIAL TRANSMITTER AND RECEIVER

This is a continuation of application Ser. No. 08/528,004, now U.S. Pat. No. 5,684,429 filed Sep. 14, 1995, which application is incorporated herein by reference.

BACKGROUND OF THE INVENTION

1. Field of the Invention.

This invention relates in general to CMOS. transmitting and receiving devices, and more specifically, to CMOS devices that use low voltage logic swings and transmission line drivers to increase the amount of data per unit time on the communications link.

2. Description of Related Art.

Complementary Metal Oxide Semiconductor (CMOS) transmitters and receivers are widely used in the industry to transport data. The low power requirements and low device costs make CMOS devices desirable for most applications, such as personal computer (PC) communications, spacecraft data storage and transmission, and mainframe computer uses. As technology has advanced, the conductive paths inside of semiconductor devices has been reduced to sub-micron widths in order to increase the on-chip processing speeds. As line widths decrease, capacitive coupling and crosstalk interfere with the device's ability to output signals strong enough to communicate with other devices. The disparity between on-chip processing speeds and inter-chip communication speeds becomes increasingly troublesome as CMOS technology scales down into the sub-micron region. Other technologies, such as Gallium Arsenide (GaAs), and other logic families, such as Emitter Coupled Logic (ECL), use lower voltage swings and transmission line drivers and receivers, thereby reducing the interference problem of small on-chip line widths and allowing higher speed data transmission. However, GaAs and ECL require more power than CMOS devices, therefore making these alternative devices unsuitable where low power consumption is an important design criteria.

It can be seen then that there is a need for a CMOS device that uses low voltage swings which allows for a higher speed CMOS transmission link. It can also be seen that there is a need for a CMOS device that uses transmission line effects for more efficient transmission of data. Further, there is a need for a CMOS device that can interface with either a CMOS or ECL transmitter/receiver.

SUMMARY OF THE INVENTION

To overcome the limitations in the prior art described above, and to overcome other limitations that will become apparent upon reading and understanding the present specification, the present invention discloses a powerful apparatus and method for increasing the speed of CMOS data transmission. The present invention allows for gigabit per second data transmission using CMOS technology, thereby making CMOS data transmission speeds comparable to speeds currently only achieved by GaAs or ECL devices.

The present invention solves the above-described problems by providing a biasing network which limits the CMOS amplifier to a lower voltage swing output, thereby increasing the bandwidth of the CMOS devices, which results in an increase in data transmission speed.

A system in accordance with the principles of the present invention comprises a transmitter and receiver, each of which comprise a current source to supply current to the amplifier, a current sink to draw the current from the amplifier, two branches of the main amplifier to receive the positive and negative signals to be transmitted, and a biasing circuit to properly offset the output signal and limit the output voltage swing.

One object of the present invention is to provide gigabit per second inter-chip communications speeds.

Another object of the present invention is to utilize transmission line effects so transmission and reception of data is performed more efficiently.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout, in which the operation and design methodology of the differential transmitter and differential receiver are described.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides an apparatus and method for using CMOS technology to transmit and receive data at speeds of approximately one gigabit per second. The high speed is accomplished by biasing the CMOS transmitter and receiver, which increases the bandwidth of the CMOS devices.

Figure 1:
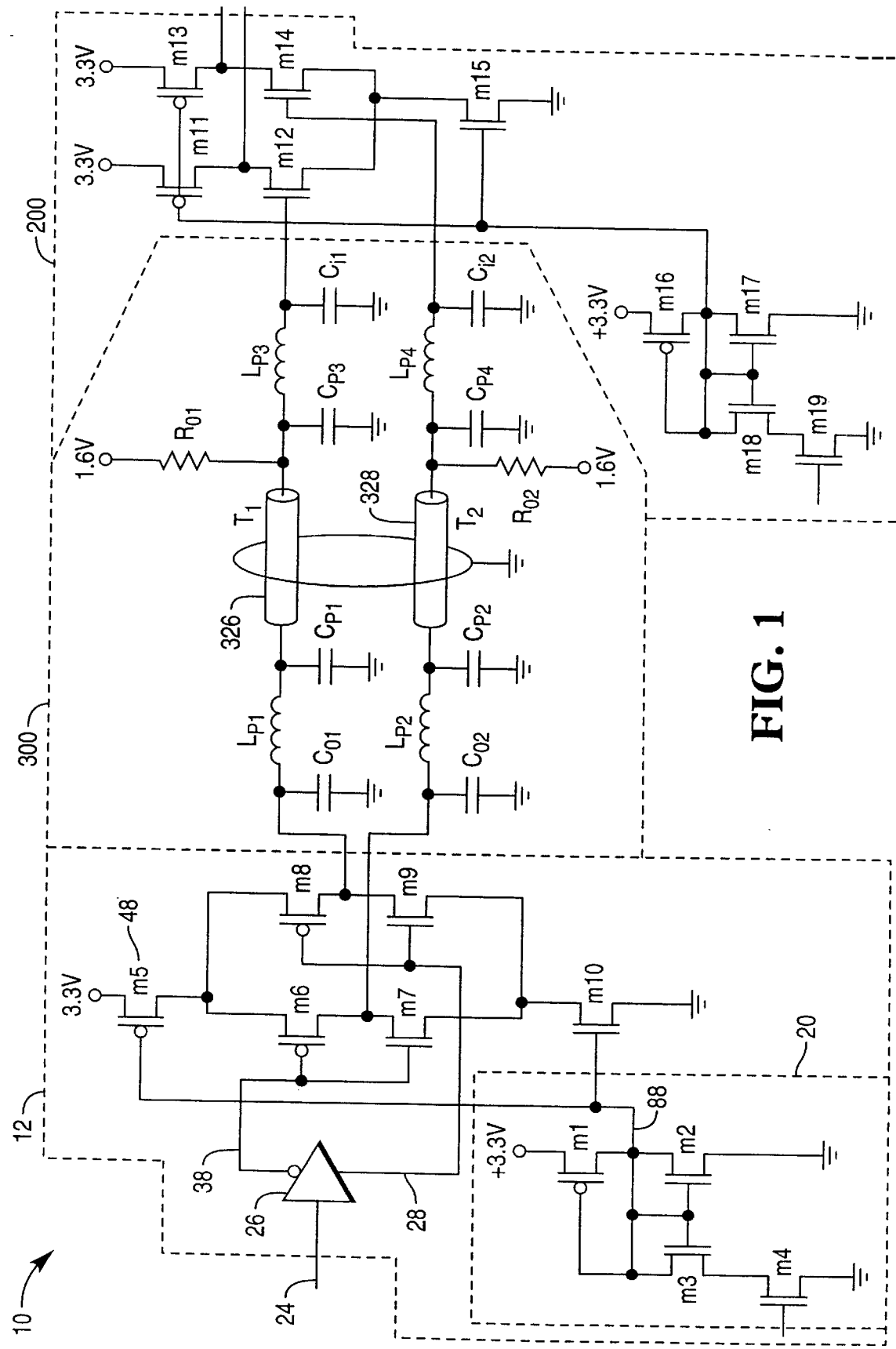
FIG. 1 is a schematic of the transmitter, receiver and a load transmission line.
Figure 2:
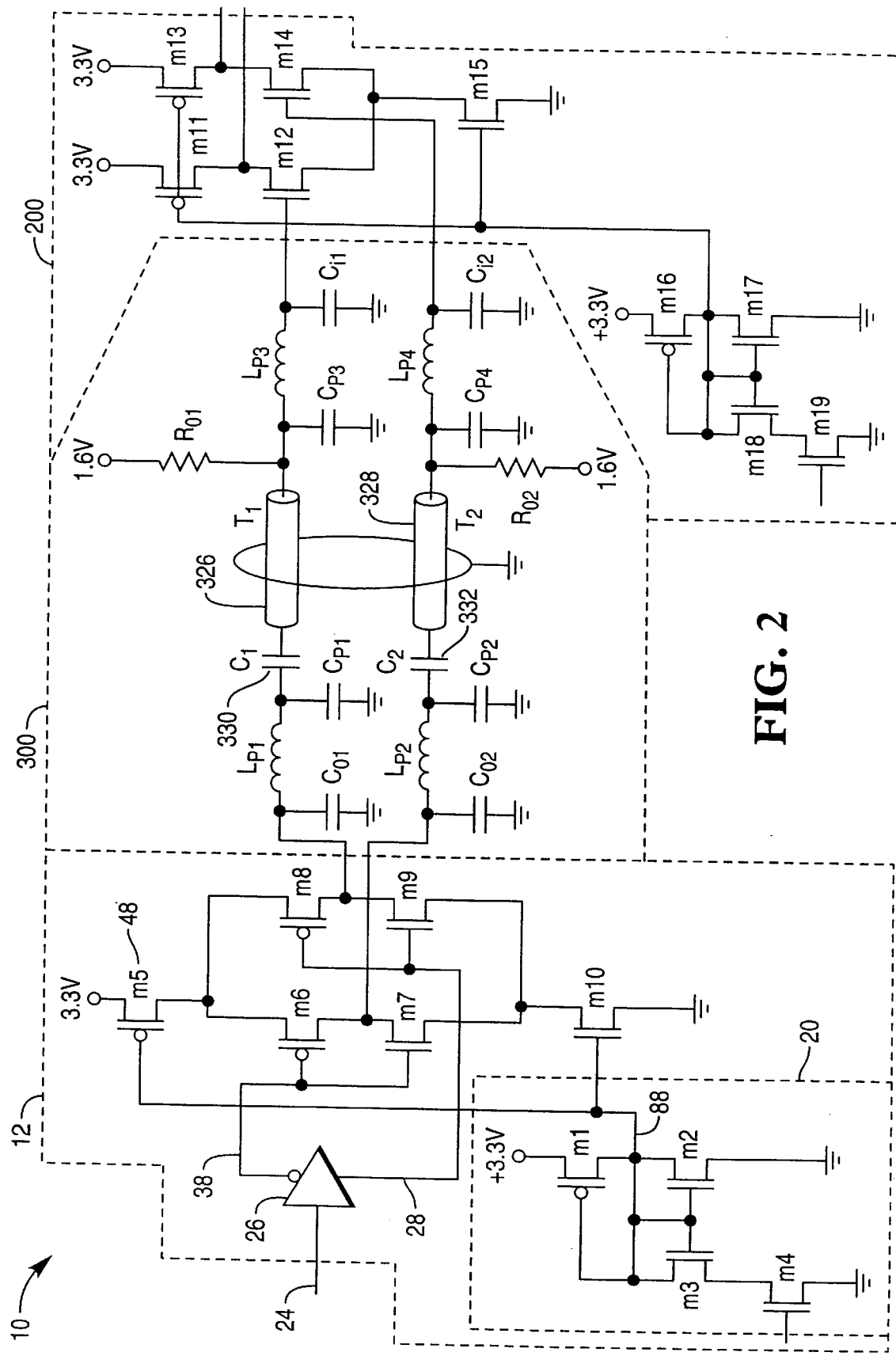
FIG. 2 is an illustration of an AC coupled scheme using the transmitter and the receiver.
Figure 3:
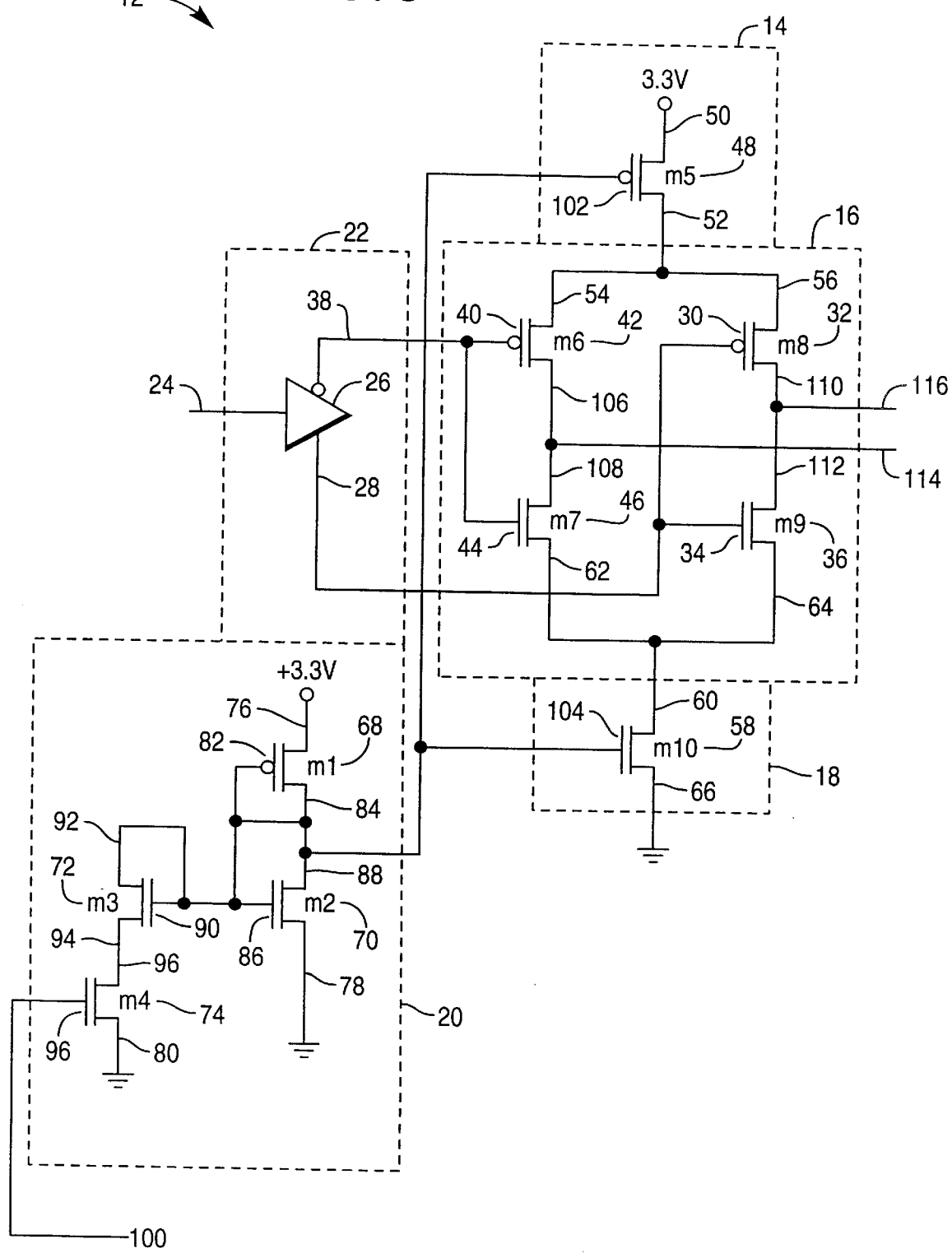
FIG. 3 is a schematic of the transmitter.
Figure 4:
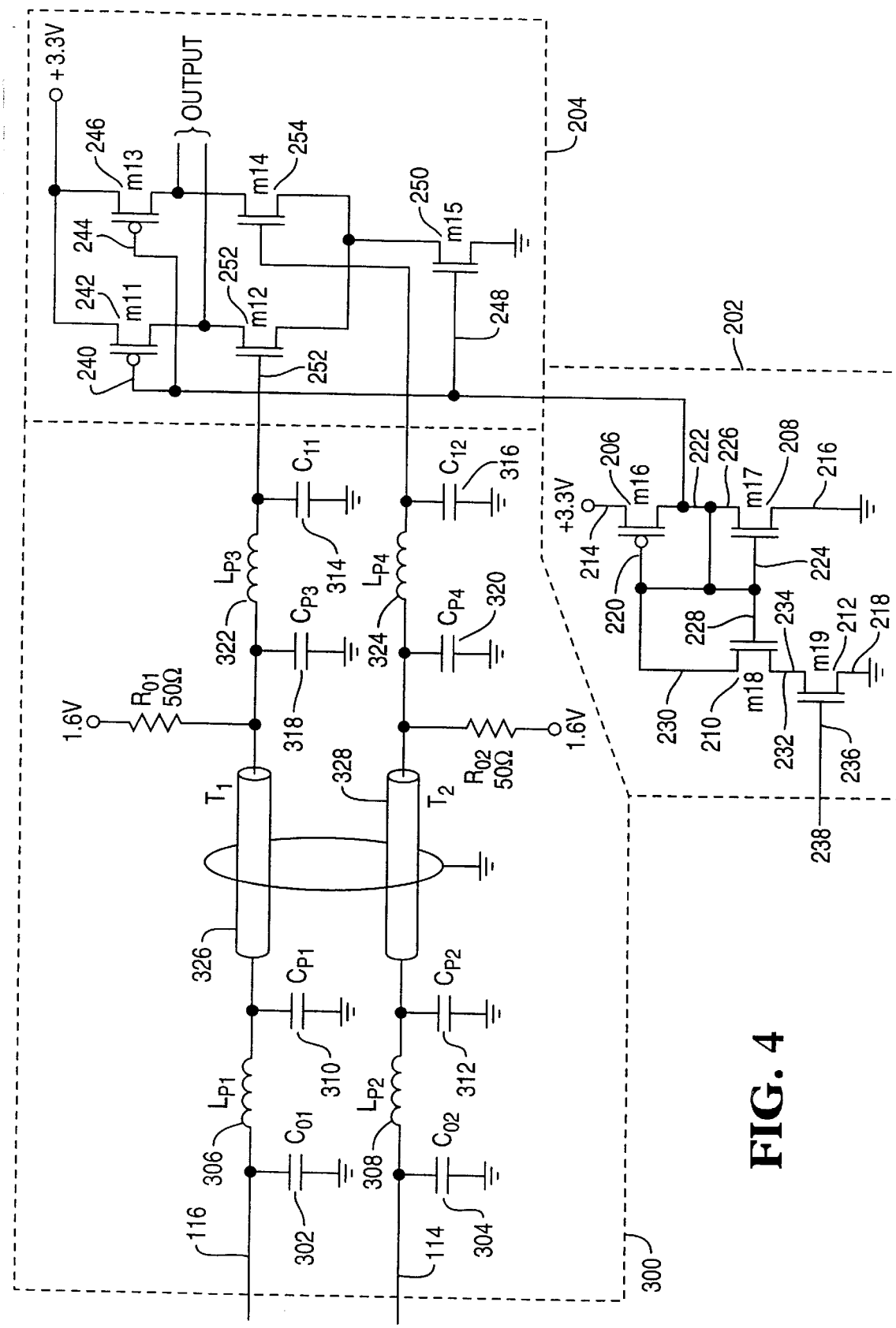
FIG. 4 is a schematic of the receiver.
Figure 5:
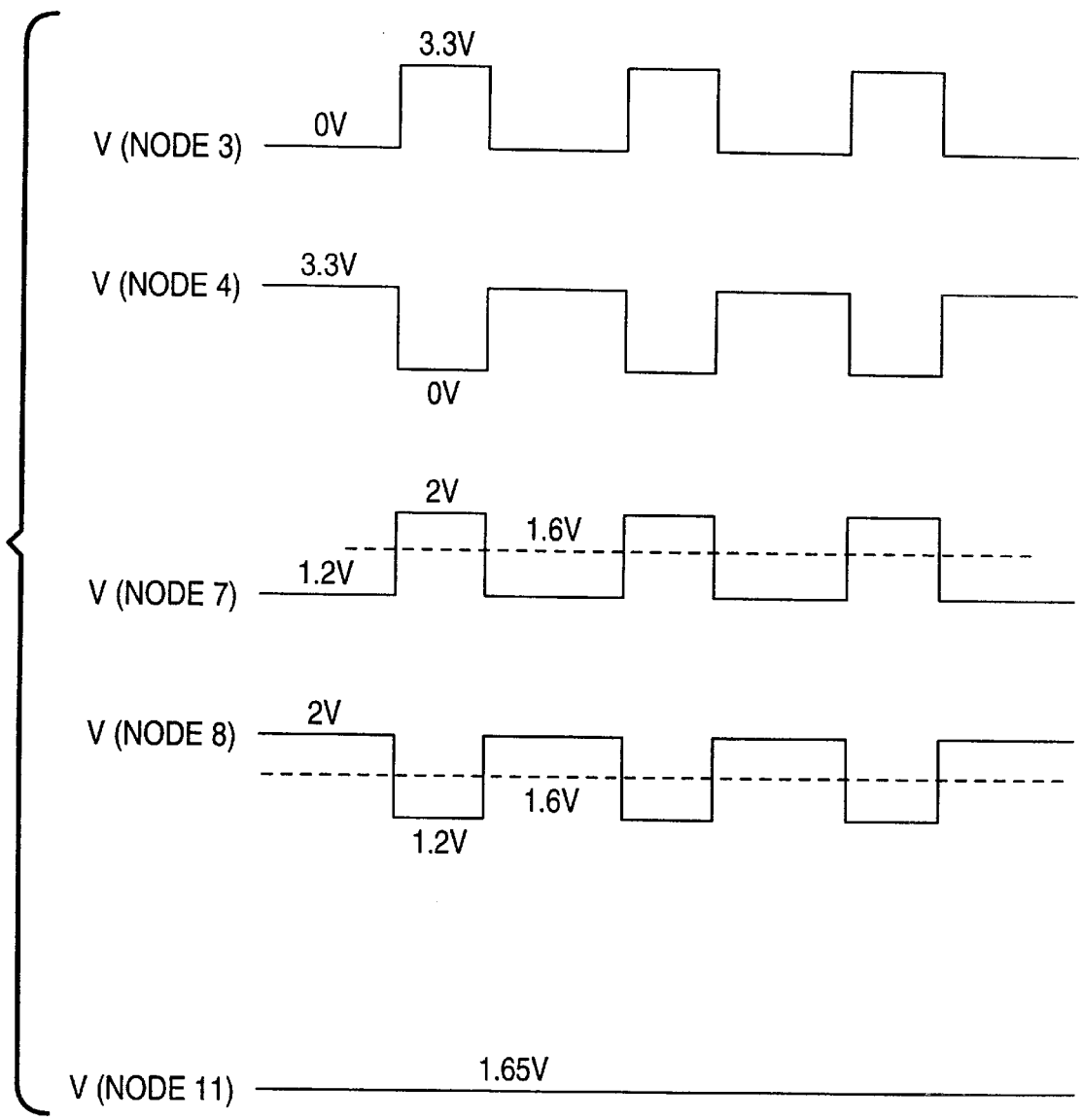
FIG. 5 shows characteristic waveforms produced by the transmitter.

FIG. 1 is a schematic of an exemplary system 10 containing the transmitter 12, receiver 200 and a load transmission line 300 where the transmitter 12 and receiver 200 are DC coupled. FIG. 2 is a schematic of an exemplary system 10 where the transmitter 12 and the receiver 200 are AC coupled. FIG. 3 is a schematic of a transmitter 12. FIG. 4 is a schematic of a receiver 200. FIG. 5 shows some characteristic waveforms from selected output points in the transmitter 12.

Referring to FIGS. 1 and 3, the transmitter 12 comprises a current source 14, an amplifier stage 16, a current sink 18, a biasing circuit 20, and a preamplifier stage 22.

The signal to be transmitted is the input signal 24 which is the input to the preamplifier stage 22. The preamplifier stage 22 turns the single ended input signal 24 into a differential signal via the differential preamplifier 26. The positive differential output 28 of the differential preamplifier 26 is connected to the gate 30 of PMOS transistor m8 32 and the gate 34 of the NMOS transistor m9 36. Similarly, the negative differential output 38 of the differential preamplifier 26 is connected to the gate 40 of the PMOS transistor m6 42 and to the gate 44 of the NMOS transistor m7 46.

The current source 14 is comprised of PMOS transistor m5 48. The drain 50 of PMOS transistor m5 48 is connected to the power supply voltage, which in the exemplary system 10 is defined as 3.3 volts. Those skilled in the art will recognize that a different power supply voltage, such as 5 volts, could be utilized in accordance with the present invention. The source 52 of PMOS transistor m5 48 is connected to the drain 54 of PMOS transistor m6 42 and the drain 56 of PMOS transistor m8 32, both located in the amplifier stage 16.

The current sink 18 is comprised of NMOS transistor m10 58. The drain 60 of NMOS transistor m10 58 is connected to the source 62 of NMOS transistor m7 46 and the source 64 of NMOS transistor m9 36. The drain 66 of NMOS transistor m10 58 is connected to ground.

The biasing circuit 20 consists of PMOS transistor m1 68, NMOS transistor m2 70, NMOS transistor m3 72, and NMOS transistor m4 74. The drain 76 of PMOS transistor m1 68 is connected to the power supply voltage. The source 78 of NMOS transistor m2 70 and the source 80 of NMOS transistor m4 74 are both connected to ground. The gate 82 of PMOS transistor m1 68 is connected to five different locations: the drain 84 of PMOS transistor m1 68, the gate 86 and the drain 88 of NMOS transistor m2 78, and the gate 90 and the drain 92 of NMOS transistor m3 72. The source 94 of NMOS transistor m3 72 is connected to the drain 96 of NMOS transistor m4 74. The gate 96 of NMOS transistor m4 74 is connected to Vsel1 signal 100. Source 84 of PMOS transistor m1 68 is connected to gate 102 of PMOS transistor m5 48 and the gate 104 of NMOS transistor m10 58.

Within the amplifier stage 16, the source 106 of PMOS transistor m6 42 is connected to the drain 108 of NMOS transistor m7 46. The source 110 of PMOS transistor m8 32 is connected to the drain 112 of NMOS transistor m9 36.

The input signal 24 is transformed into a differential signal by the differential preamplifier 26. The positive output 28 is fed to gate 30 and gate 34, and the negative output 38 is fed to gate 40 and gate 44. When the positive output 28 is high, the negative output 38 is low. The positive output 28 in the high state and the negative output 38 in the low state turns on NMOS transistor m9 36 and PMOS transistor m6 42, and turns off PMOS transistor m8 38 and NMOS transistor m7 46. This supplies current to positive output port 114 through PMOS transistor m5 48 and PMOS transistor m6 42, and sinks current from negative output port 116 through NMOS transistor m9 36 and NMOS transistor m10 58.

When positive output 28 is low, negative output 38 is high. Negative output 38 in the high state and the positive output 28 in the low state turns off NMOS transistor m9 36 and PMOS transistor m6 42, and turns on PMOS transistor m8 32 and NMOS transistor m7 46. This supplies current to negative output port 116 through PMOS transistor m5 48 and PMOS transistor m8 32, and sinks current from positive output port 114 through NMOS transistor m7 46 and NMOS transistor m10 58.

The biasing circuit 20 is designed to set a specific voltage at the drain 88 of NMOS transistor m2 70. The voltage at the drain 88 is used to optimize the midpoint and amplitude of the transmitter's output voltages at the negative output port 116 and the positive output port 114 for the input common mode range and signal amplitude required by the type of receiver used. It also compensates the shift in output voltage caused by variations in transistor processing. If a Low Voltage CMOS (LVCMOS) receiver is used, the bias voltage is set to 1.65 V by making Vsel1 signal 100 low. This turns off NMOS transistor m4 74 and prevents current flow through NMOS transistor m3 72. The only current flow in the biasing circuit 20 is through PMOS transistor m1 68 and NMOS transistor m2 70. The resistance of PMOS transistor m1 68 and NMOS transistor m2 70 are virtually identical, resulting in a voltage divide with 1.65 Volts at the drain 88 of NMOS transistor m2 70. The design of PMOS transistors m5 48, m6 42, and m8 32 are designed such that when the gate 102 of PMOS transistor m5 48 is at 1.65 Volts and the gate 40 of PMOS transistor m6 42 (or the gate 30 of PMOS transistor m8 32) is at 0V, the series combination of PMOS transistor m5 48 and either PMOS transistor m6 42 (or PMOS transistor m8 32) will source 8 ma current into a 50 ohm load terminated to 1.6 V.

Similarly, the NMOS transistors m10 58, m7 46, and m9 36 are designed to sink 8 ma from a 50 ohm load connected to 1.6 V when the gate 104 of NMOS transistor m10 58 is at 1.65 V and the gate 44 of NMOS transistor m7 46 (or the gate 34 of NMOS transistor m9 36) is at 3.3 V. This design results in a +/−400 mv peak to peak voltage swing centered around 1.6 V at the negative output port 116 and the positive output port 114 of the transmitter 12. This is an optimum input for a LVCMOS receiver.

If a low voltage Pseudo Emitter Coupled Logic (PECL) based receiver is used, the bias voltage is set to 1.4 V by connecting Vsel1 to high. Now current can flow through NMOS transistors m3 72 and m4 74. This changes the effective resistance of NMOS transistor m2 70 by placing two equivalent resistances in parallel, thereby lowering the voltage across NMOS transistor m2 70 to 1.4 Volts. If the voltage at the drain 88 of NMOS transistor m2 70 is at 1.4 Volts, the output of the transmitter 12 at the negative output port 114 and the positive output port 116 will be a +/− 400 mv peak-to-peak swing centered around 2 V, an optimum input for a PECL receiver. Voltages at specific reference numerals and transistor on-off states for other input states are tabulated in Table 1.

The two states for the biasing circuit 20 are when Vsel1 signal 100 =0, and when Vsel1 signal 100 =3.3 V. When Vsel1 signal 100 =0, NMOS transistors m3 72 and m4 74 are off. PMOS transistor m1 68 and NMOS transistor m2 70 form a conventional CMOS inverter with its output connected to its input. Therefore, standard MOS equations can be used to describe the operation. The relationship is:

$$Vout = \left(Vdd + Vtp + Vtn\sqrt{\beta n/\beta p}\right) / \left(1 + \sqrt{\beta n/\beta p}\right)$$

Since $$\beta = (\mu e/T_{ox})(W/L)$$

$$\beta n/\beta p = (Wn \times \mu n)/(Wp \times \mu p) = 2 \times Wn/Wp$$

$$Vout = \left(Vdd + Vtp + Vtn\sqrt{2 \times Wn/Wp}\right) / \left(1 + \sqrt{2 \times Wn/Wp}\right)$$

Substituting

Vdd=3.3 V,

Vtp=0.6 V,

Vtn=0.6 V,

Wn=8 microns, and

Wp=16 microns we obtain Vout=1.65 V as desired, where,

Vdd is the supply voltage (3.3 V),

Vtp is the threshold voltage of a P-channel device,

Vtn is the threshold voltage of N-channel device,

βn is the N-channel device gain factor,

βp is the P-channel device gain factor,

W is the channel width of the device,

Wn is the channel width of an N-channel device,

Wp is the channel width of a P-channel device, $\mu n$ is the electron mobility for N-channel devices, and $\mu p$, is the electron mobility for P-channel devices.

When Vsel1 is set to 3.3 V, NMOS transistors m3 72 and m4 74 are turned on and the series combination of m3 72 and m4 74 are connected in parallel with m2 70. The channel width of m3 and m4 are chosen as Wnm3 =Wnm4=16 micron.

$$Vout = \frac{\left(Vdd + Vtp + Vtn\sqrt{2(W_nm2 + 0.5W_nm3)/W_pm1}\right)}{\left(1 + \sqrt{2(W_nm2 + 0.5W_nm3)/W_pm1}\right)}$$

Substituting values, we obtain Vout=1.4 V.

The receiver 200 is shown in FIG. 1 and FIG. 4. The receiver 200 consists of a biasing circuit 202 and an amplifier stage 204. The biasing circuit 202 consists of PMOS transistor m16 206, NMOS transistor m17 208, NMOS transistor m18 210, and NMOS transistor m19 212. The drain 214 of PMOS transistor m16 206 is connected to the power supply voltage. The source 216 of NMOS transistor m17 208 and the source 218 of NMOS transistor m19 212 are both connected to ground. The gate 220 of PMOS transistor m16 206 is connected to five different locations: the drain 222 of PMOS transistor m16 206, the gate 224 and the drain 226 of NMOS transistor m17 208, and the gate 228 and the drain 230 of NMOS transistor m18 210. The source 232 of NMOS transistor m18 210 is connected to the drain 234 of NMOS transistor m19 212. The gate 236 of NMOS transistor m19 212 is connected to Vsel2 signal 238. Source 222 of PMOS transistor m16 206 is connected to gate 240 of PMOS transistor m11 242, the gate 244 of PMOS transistor m13 246, and the gate 248 of NMOS transistor m15 250. The biasing circuit 202 function is identical to that of biasing circuit 20.

The amplifier stage 204 consists of PMOS transistors m11 242 and m13 246, and NMOS transistors m15 250, m12 252, and m14 254. The operation of amplifier stage 204 is similar to amplifier stage 16 for the transmitter 12, except the current source is the power supply (3.3 volts) instead of a transistor connected to the power supply.

The bias voltage at the source 222 of PMOS transistor m16 206 is set to match the input signal. For LVCMOS, the voltage is set to 1.65 V and for LVPECL it is set to 1.4 V. The bias voltage determines the magnitude of current in the constant current source NMOS transistor m15 250 and compensates for variations due to manufacturing process tolerances.

FIG. 1 also shows a differential transmission line 300 connecting the transmitter 12 and the receiver 200. The transmitter output capacitance is modeled by capacitors C01 302 and C02 304, which are of equal value. The transmitter package inductance is modeled by inductors Lp1 306 and Lp2 308, which are approximately equal. The package capacitance is modeled by capacitors Cp1 308 and Cp2 310, which are also of approximately equal value.

Similarly, the receiver input capacitance is modeled by capacitors Ci1 314 and Ci2 316, the receiver package capacitance is modeled by capacitors Cp3 318 and Cp4 320, and the receiver package inductance is modeled by inductors Lp3 322 and Lp4 324. The transmission lines T1 326 and T2 328 can be made of cable, but it can be recognized by one skilled in the art that the transmission line can also be made on a Printed Wiring Board (PWB). The receiver also has terminating resistors R01 326 and R02 328 which terminate the transmission signals into 50 ohms for both positive and negative signals. Resistors R01 326 and R02 328 are both terminated into 1.6 Volts.

FIG. 2 is an illustration of an AC coupled scheme using the transmitter and the receiver. Capacitors C1 330 and C2 332 isolate the DC currents from the transmitter 12 from the transmission lines T1 326 and T2 328, but allow alternating current to pass through to the receiver 200.

FIG. 5 shows some representative characteristic waveforms produced by the transmitter 12. The waveforms of the voltages at the positive output 28 and the negative output 38 of the differential preamplifier 26, the negative output port 116 and the positive output port 114, and the drain 88 of NMOS transistor m2 70 are shown in FIG. 5 for the case of Bias Voltage=1.65 V.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

TABLE 1

| Input V (38) | Input V (28) | Bias voltage V (88) | ON Transistors | OFF Transistors | Output V (114) | Output V (116) |
|---|---|---|---|---|---|---|
| 3.3 V | 0 V | 1.65 V | m5, m7, m8, m10 | m6, m9 | 2 V | 1.2 V |
| 0 V | 3.3 V | 1.65 V | m5, m6, m9, m10 | m7, m8 | 1.2 V | 2.0 V |
| 3.3 V | 0 V | 1.4 V | m5, m7, m8, m10 | m6, m9 | 2.4 V | 1.6 V |
| 0 V | 3.3 V | 1.4 V | m5, m6, m9, m10 | m7, m8 | 1.6 V | 2.4 V |

What is claimed is:

1. A method for transmitting a signal using one or more differential amplifiers, comprising the steps of:

selectively biasing the differential amplifier using a bias to selectively offset the output voltage of the differential amplifier, wherein the offset output voltage is selectively compatible with a CMOS logic level receiver or a LVPECL logic level receiver; and amplifying the signal with the differential amplifier using the selective bias to control an amplitude and a midpoint of the output voltage swing of the differential amplifier.

2. The method of claim 1, wherein the method further comprises the step of preamplifying the signal with a second amplifier.

3. The method of claim 1, wherein the step of biasing the differential amplifier is performed by at least one MOS transistor.

4. A method of receiving a signal using one or more differential amplifiers, comprising the steps of:

selectively biasing the differential amplifier using a bias to selectively offset the voltage swing of the received signal, wherein the selectively offset voltage swing is compatible with a CMOS logic level or a LVPECL logic level; and amplifying the received signal with the differential amplifier using the selective bias to control an amplitude and a midpoint of the voltage swing of the received signal.

5. The method of claim 4, wherein the step of biasing the differential amplifier is performed by at least one MOS transistor.

* * * * *